United States Patent [19]
Lur et al.

[11] Patent Number: 5,580,701
[45] Date of Patent: Dec. 3, 1996

[54] PROCESS FOR ELIMINATION OF STANDING WAVE EFFECT OF PHOTORESIST

[75] Inventors: Water Lur, Taipei; Po-Wen Yen, Hsin-Chu City, both of Taiwan

[73] Assignee: United Microelectronics Corporation, Taiwan

[21] Appl. No.: 261,057

[22] Filed: Jun. 16, 1994

[51] Int. Cl.$^6$ ...................................................... H01L 21/00
[52] U.S. Cl. ........................... 430/316; 430/317; 430/950; 437/229; 156/659.11; 156/661.11; 156/662.1
[58] Field of Search ........................ 156/659.11, 661.11, 156/662.1, 657.1; 437/225, 228, 229; 430/316, 313, 317, 318, 950

[56] References Cited

U.S. PATENT DOCUMENTS 5,437,961  8/1995  Yano et al. ........................ 156/643.1 X

*Primary Examiner*—Thi Dang
*Attorney, Agent, or Firm*—Meltzer, Lippe, Goldstein, et al.

[57] ABSTRACT

A method is disclosed which eliminates standing waves in the photoresist layer of VLSI devices. A layer of anti-reflecting material is deposited between the photoresist and its underlying poly layer. This anti-reflecting layer is formed with an appropriate thickness and index of refraction so that none of the lithographic light incident on the photoresist is reflected back from the underlying layer. This eliminates the interference between incident and reflected light in the photoresist, thus preventing the occurrence of standing waves.

8 Claims, 4 Drawing Sheets

5,580,701

PROCESS FOR ELIMINATION OF STANDING WAVE EFFECT OF PHOTORESIST

FIELD OF THE INVENTION

The present invention relates to the fabrication of VLSI circuits. In particular, the present invention relates to a technique for eliminating the standing wave effect in a photoresist layer used as a mask to pattern another layer in a VLSI fabrication process.

BACKGROUND OF THE INVENTION

A typical photoresist lithography process used in the fabrication of a semiconductor operates as follows. A layer of material to be patterned is formed on a substrate. The layer to be patterned may be polysilicon, polycide, silicon oxide, nitride or metal. Then, a layer of photoresist is deposited on the layer to be patterned. Thereafter, the photoresist is exposed in selected regions with light through a mask. The photoresist is then removed in the regions other than the selected regions. Then, a process can be performed in the underlying layer through the removed portions of the photoresist, such as removing portions of the underlying layer to be patterned.

The thickness of the photoresist layer varies considerably as a function of its position on the substrate surface, especially during the back-end process steps in the fabrication of a silicon wafer. Referring to FIG. 1, such differences in photoresist thickness are represented by $t_1$ and $t_2$. In this cross-section view, the photoresist (PR) layer covers a polysilicon or polycide (poly) layer in preparation for the lithographic process. When light (illustratively ultra-violet) is directed at the photoresist surface, approximately 50% of the incident beam is reflected back into the photoresist from the poly layer. As indicated in FIG. 2, incident light $uv_i$ and reflected light $uv_r$ combine in the PR layer to create interferences, or standing waves.

Thus, when the photoresist is exposed to incident light during the lithographic process, standing waves occur in the photoresist, which cause distortions in the patterns on the underlying layer, as determined by the thickness variations in the photoresist. For example, as illustrated in FIG. 3, ultra-violet light 10 is directed through a mask 20 to the photoresist layer, which is polymerized in the areas (30,40) not covered by the mask. Ideally, these polymerized areas are uniformly aligned with their respective mask openings, as indicated by the width w in FIG. 3, which assumes minimal impact from standing waves in the $t_1$ thickness region of the PR layer. In the $t_2$ thickness region, however, the standing wave effect causes a distortion in this polymerized area, as indicated by width $w_{pr}$. Since the function of the polymerized PR is to form a mask for patterning the underlying poly layer, any distortions in the PR mask are replicated in the poly layer patterns. For example, necking and bridging are two types of distortions caused by the standing wave effect, as depicted in the top view of a poly layer in FIG. 4. Such pattern distortions are detrimental to both yield and performance of semiconductor devices, and become an increasingly serious problem as the scale of VLSI devices diminishes.

The above described standing wave effect of the photoresist results in necking and bridging of adjacent pattern lines in the underlying poly (or metal) layer. The standing wave effect becomes a serious production problem as the scale of VLSI fabrication continues to decrease.

In the prior art, an additional layer of anti-reflecting material has been used between the photoresist and the underlying layer. For metal layers, where the reflectivity is near 100% for ultra-violet light, the standing wave problem has been solved by depositing a thin layer of anti-reflecting material on the metal surface. This reduces the reflectance of the metal layer to approximately one fifth of its uncoated value.

For polysilicon or polycide layers, where the reflectivity is about 50% for ultra-violet light, a thin organic resist-like layer has been used in various ways, including top-coating and bottom coating, after and before layering the photoresist. These techniques have numerous disadvantages, however, such as process complexity, layer stripping, and contamination.

It is an object of this invention to overcome the aforementioned disadvantages when using polysilicon or polycide layers in the VLSI fabrication process. It is a further object of this invention to improve the product yield and performance of VLSI devices by using anti-reflecting materials of proven reliability.

SUMMARY OF THE INVENTION

The disclosed invention comprises a method and structure for fabricating VLSI circuits which eliminates the standing wave effect of photoresist. This is achieved in the following manner. One or more layers of anti-reflecting materials are deposited on the surface of a poly layer to be patterned. A layer of photoresist is then formed on the surface of the anti-reflecting layer(s). The photoresist layer is then selectively exposed to incident light using a photo-lithographic process in order to polymerize selected sections of the photoresist. Illustratively the sections other than the selected polymerized sections of photoresist are removed to uncover (i.e., expose) underlying portions of the poly layer to be patterned. Etching techniques can then be used to remove the uncovered portions of the underlying poly layer.

The anti-reflecting materials used in the inventive process are well-known, reliable films, such as $SiO_2$, $Si_3N_4$, $SiO_xN_y$, and amorphous silicon. For maximum effectiveness in reducing reflectivity, the thickness of the anti-reflecting layer must be equal to $$W_1/4I_r$$

where $W_1$ is the wavelength of the incident light, and $I_r$ is the index of refraction of the anti-reflecting layer.

Use of the above described anti-reflecting materials layered on polysilicon or polycide effectively eliminates light reflection into the photoresist. This solves the standing wave problem, which preserves the integrity of the photo-lithographic process. Additionally, the maturity of the anti-reflecting materials used in the inventive process enhances the yield and performance of the VLSI devices.

DETAILED DESCRIPTION OF THE INVENTION

As summarized above, the purpose of the disclosed invention is to eliminate standing waves in the photoresist, which result from incident and reflected light interferences in the photoresist layer. Such standing waves can cause distortions in the pattern lines of a lithographic process because different thicknesses of photoresist result in different pattern widths.

Figure 1:
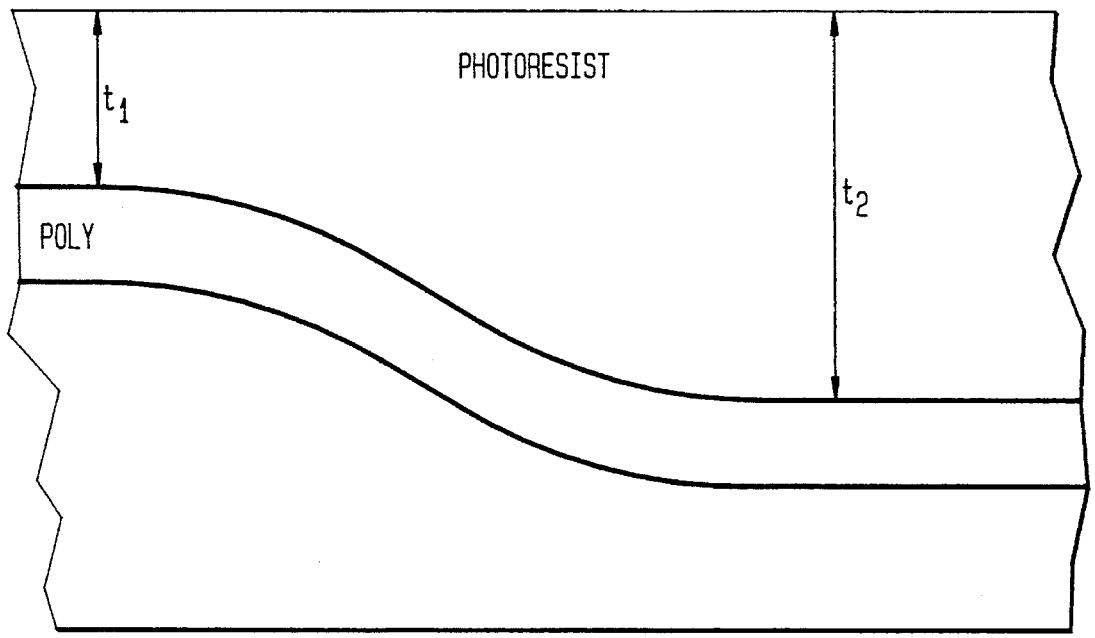
FIG. 1 illustrates typical variations in photoresist thickness on an underlying layer.
Figure 2:
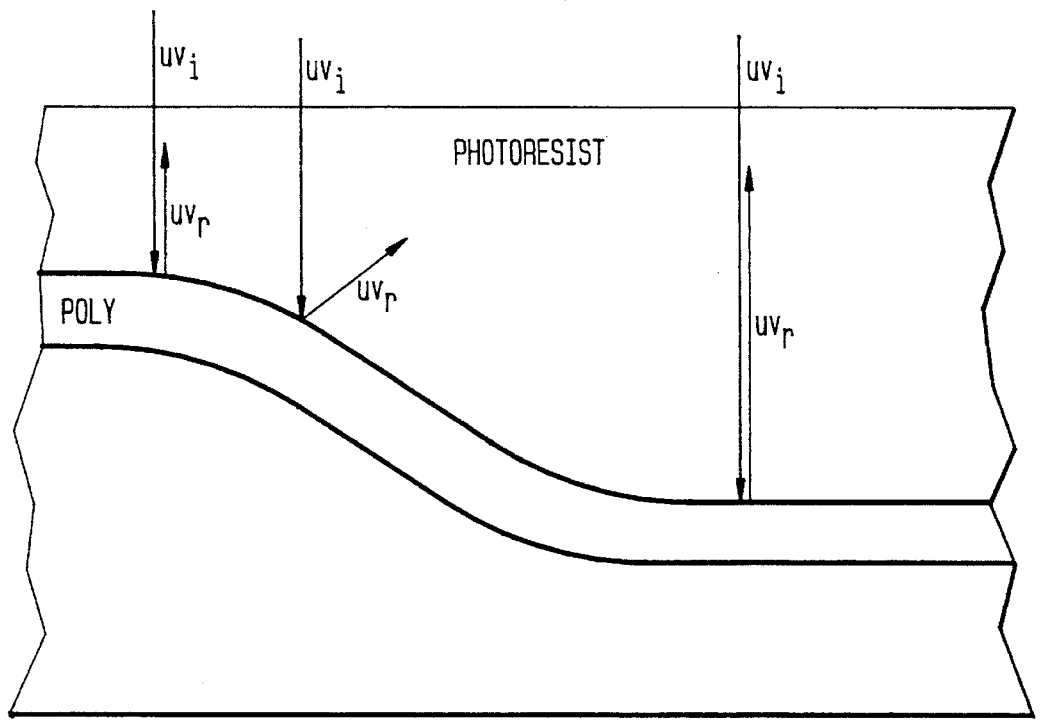
FIG. 2 illustrates incident and reflected light interferences in the photoresist layer.
Figure 3:
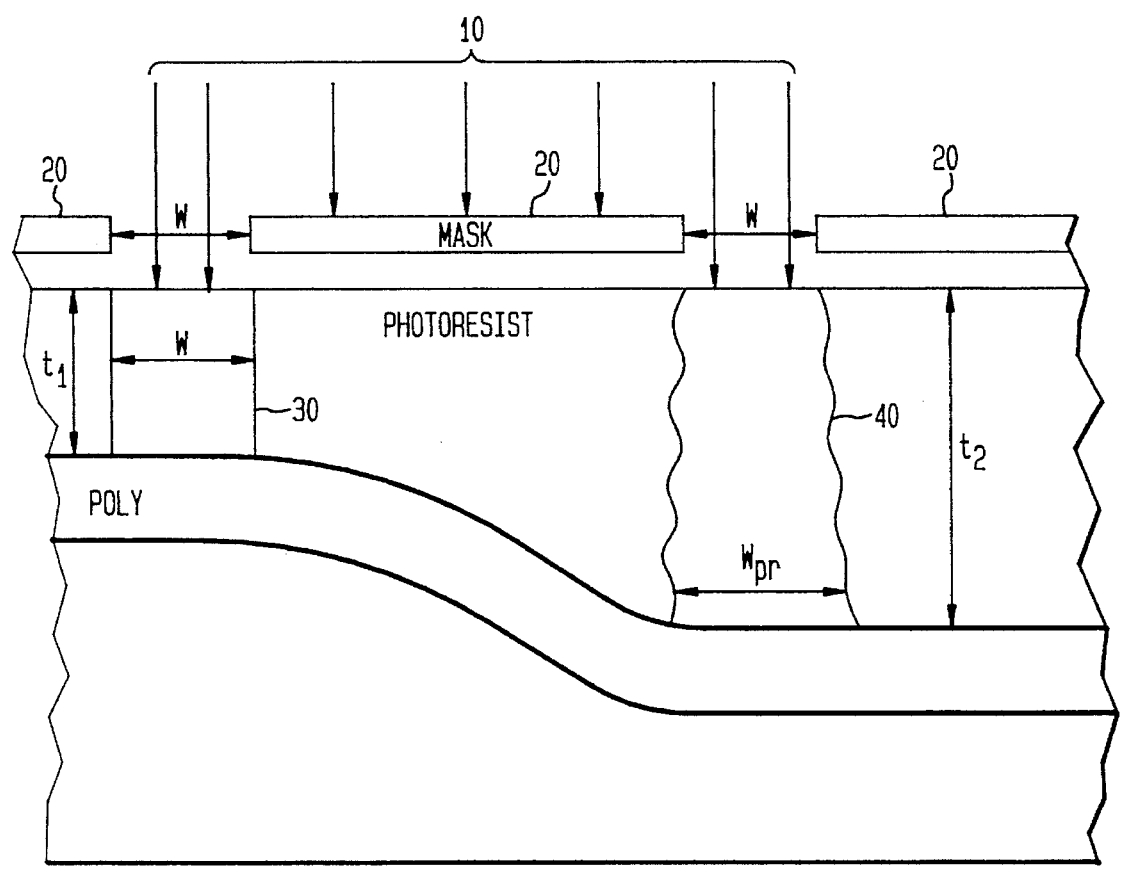
FIG. 3 illustrates the effect of standing waves in the photoresist and underlying layers.
Figure 4A:
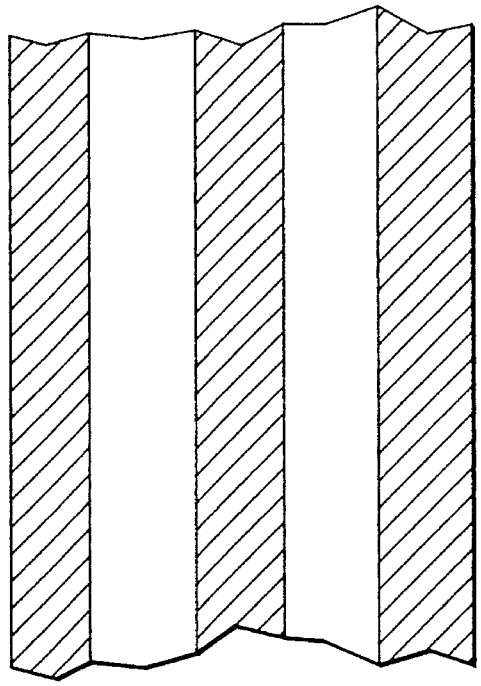
FIG. 4 depicts necking and bridging distortions in the poly layer.
Figure 4B:
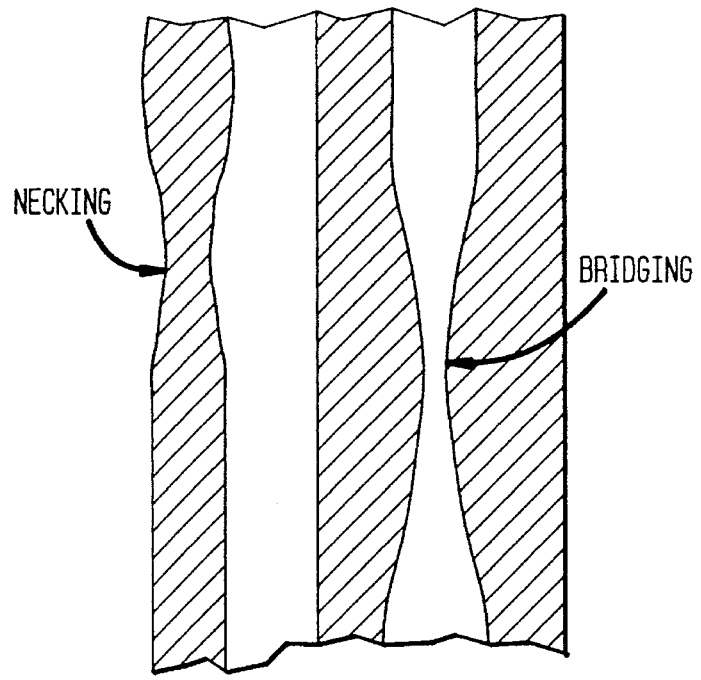
Figure 5:
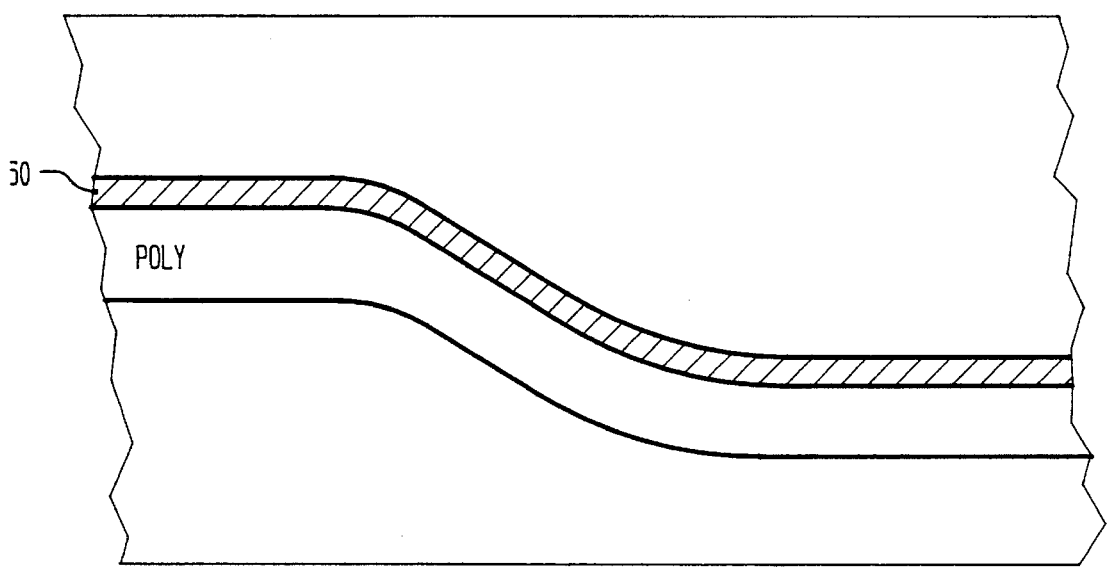
FIG. 5 illustrates the insertion of an anti-reflecting layer.

To prevent the above described distortions from occurring, it is necessary to eliminate the standing waves, or light interferences, in the PR layer. To this end, an anti-reflecting layer (ARL) 50 is positioned between the poly layer and the PR layer, as shown in FIG. 5. For stability and reliability in the manufacturing process, well-established films may be used for the ARL, such as $SiO_2$, $Si_3N_4$, $SiO_xN_y$, and amorphous silicon.

It is also necessary to select the appropriate thickness of the ARL, in conjunction with its index of refraction, in order to eliminate the reflected light from the poly layer into the PR layer. According to optics theory, a film whose thickness is equal to ¼ wavelength of the incident light, and whose index of refraction is less than that of the underlying layer, can eliminate the reflected light. Therefore, the ARL thickness must be equal to $$W_1/4I_r$$

where $W_1$ is the wavelength of the incident light, and $I_r$ is the index of refraction of the ARL.

In VLSI lithographic fabrication, high resolution and moderate depth of focus are achieved through the use of monochromatic light, such as g-line, i-line, and Excimer laser. The required film thicknesses and refraction indices of the ARL's to be used with these types of monochromatic light are listed below in Table 1.

TABLE 1

| Materials | Refraction Index | ARL Thickness g-line (4360 Å) | ARL Thickness i-line (3650 Å) | ARL Thickness Excimer laser(2480 Å) |
| --- | --- | --- | --- | --- |
| $SiO_2$ | 1.46 | 746 Å | 625 Å | 425 Å |
| $SiO_xN_y$ | ~1.75 | ~623 Å | ~5.21 Å | ~354 Å |
| $Si_3N_{(psi)}$ | 2.05 | 532 Å | 445 Å | 302 Å |
| amorphous silicon | ~3.6 | ~302 Å | ~253 Å | ~172 Å |

In practice, some offsets in the ARL thickness must be made on sloped regions of the wafer surface. An additional consideration for ARL selection is that its index of refraction must be larger than that of the PR layer, but smaller than the index of refraction of the underlying poly layer.

The above described ARL's can all be deposited by physical vapor deposition or chemical vapor deposition to the desired thickness. The oxide and nitride ARL's can also be formed over a polysilicon layer by thermal oxidation or nitridation. The amorphous silicon ARL can also be formed over a polysilicon layer by ion implantation, using $BF_2^+$, $p^+$, $As^+$, or $Ar^+$ ions, with energy doses greater than $10^{15}/cm^2$.

Figure 6:
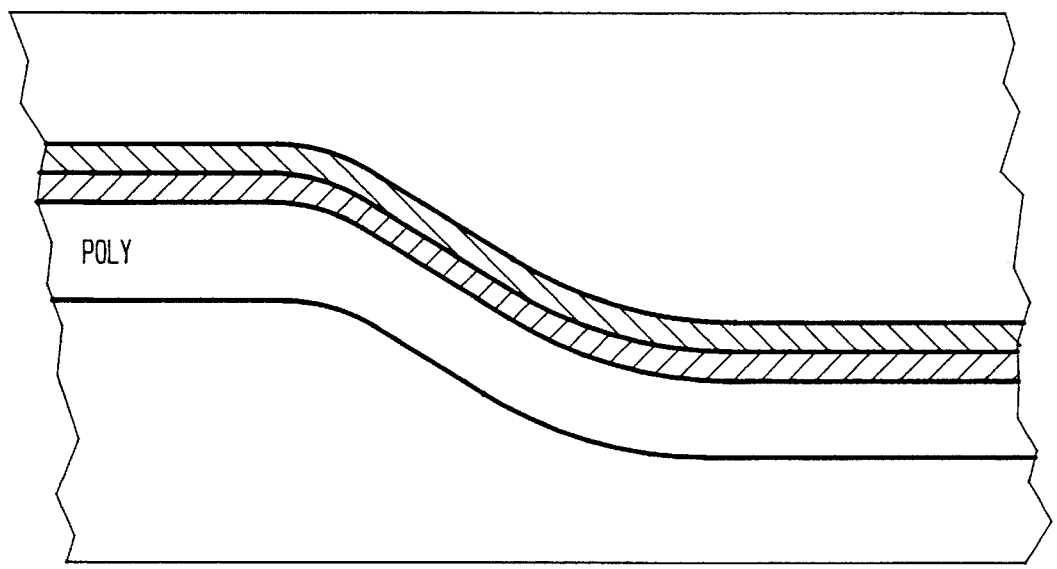
FIG. 6 depicts a multiple stack of anti-reflecting layers.

The effectiveness of the ARL layer in eliminating light reflections from the underlying layer can be further enhanced through the use of multiple stacked ARL layers, as illustrated in FIG. 6. In this example, the polysilicon layer is first covered with an amorphous silicon layer 60, which is then covered by a $SiO_2$ layer 70, and finally, the PR layer.

In summary, the disclosed invention provides an effective solution to the problem of lithographic pattern distortion caused by standing waves in the photoresist of VLSI devices. These standing waves are eliminated by inserting one or more layers of a selected group of anti-reflecting materials between the photoresist layer and its underlying polysilicon or polycide layer. The anti-reflecting materials are at a thickness which is equal to a quarter wavelength of the incident lithographic light divided by the index of refraction of the anti-reflecting material. This index of refraction of the anti-reflecting material must be less than that of the underlying poly layer, and greater than that of the overlaying photoresist layer.

Since the inventive process makes use of proven materials for the anti-reflecting layer, production yield is improved, as well as the ultimate performance of the VLSI device.

The above described embodiments are illustrative of the disclosed invention. It is to be understood, however, that the invention is not limited to these embodiments, and that various changes and modifications may be effected therein by one skilled in the art without departing from the spirit or scope of the invention as defined in the following claims.

We claim:

1. A method of photolithographic semiconductor fabrication which eliminates the standing wave effect of photoresist by reducing reflectivity, comprising the steps of:

disposing an anti-reflecting layer, having a first index of refraction within a range, on a layer to be patterned, said layer to be patterned having a second index of refraction, said anti-reflecting layer comprising a plurality of anti-reflecting materials disposed in a multiple stack configuration, each of said anti-reflecting materials having an index of refraction within said range, disposing a layer of photoresist material, having a third index of refraction, on said anti-reflecting layer, exposing selected sections of said photoresist material to incident light, removing said photoresist material other than said selected sections of said photoresist material, to uncover underlying sections of said anti-reflecting layer, removing said underlying sections of said anti-reflecting layer to uncover underlying sections of said layer to be patterned, and etching said uncovered underlying sections of said layer to be patterned, determining a thickness of each of said anti-reflecting materials to be substantially equal to $$W_1/4I_r$$

where $W_1$ is the wavelength of said incident light and $I_r$ is said index of refraction of said anti-reflecting material, and wherein said first index of refraction range is greater than said third index of refraction, and is less than said second index of refraction.

2. The method of claim 1 wherein said anti-reflecting layer comprises a material selected from the group consisting of $SiO_2$, $Si_3N_4$, $SiO_xN_y$, and amorphous silicon.

3. The method of claim 2 wherein said anti-reflecting layer comprises $SiO_2$ formed by thermal oxidation.

4. The method of claim 2 wherein said anti-reflecting layer comprises $Si_3N_4$ formed by thermal nitridation.

5. The method of claim 2 wherein said anti-reflecting layer comprises $SiO_xN_y$ formed by thermal nitridation.

6. The method of claim 2 wherein said anti-reflecting layer comprises amorphous silicon containing ions implanted by ion implantation.

7. The method of claim 6 wherein said ion implantation uses ions selected from the group consisting of $BF_2^+$, $P^+$, $As^+$, and $Ar^+$.

8. The method of claim 7 wherein said ion implantation uses energy dosage levels greater than $10^{15} ev/cm^2$.

* * * * *